United States Patent [19]

Batlogg et al.

[11] Patent Number: 5,389,603
[45] Date of Patent: Feb. 14, 1995

[54] OXIDE SUPERCONDUCTORS, AND DEVICES AND SYSTEMS COMPRISING SUCH A SUPERCONDUCTOR

[75] Inventors: Bertram J. Batlogg, New Providence; Robert J. Cava, Bridgewater, both of N.J.

[73] Assignee: AT&T Corp., Murray Hill, N.J.

[21] Appl. No.: 484,457

[22] Filed: Feb. 9, 1990

Related U.S. Application Data

[63] Continuation of Ser. No. 262,549, Oct. 25, 1988, abandoned.

[51] Int. Cl.$^6$ .................. H01L 39/12; H01B 12/00
[52] U.S. Cl. .................. 505/120; 505/776; 505/779; 505/782; 505/783; 505/121; 505/125; 505/220; 505/500; 505/501; 252/518; 252/521
[58] Field of Search ............. 505/776, 779, 782, 783, 505/1; 252/518, 521

[56] References Cited

U.S. PATENT DOCUMENTS

| | | | |
|---|---|---|---|
| 3,932,315 | 1/1976 | Sleight | 252/521 |
| 4,880,773 | 11/1989 | Itozaki et al. | 252/521 |
| 4,894,361 | 1/1990 | Subramarian | 501/123 |
| 5,190,914 | 3/1993 | Koriyama et al. | 505/1 |

OTHER PUBLICATIONS

Manthiram "Dependence of TC on hole concentration . . ." *Appl. Phys. Lett.* v. 53(5) Aug. 1, 1988 pp. 420–422.
Hewat "HREM Study of Bi-oxide based high $T_c$ . . ." *J. Microsc. Spectrosc. Electron.*, v 13 Aug. 1988 pp. 297–306.
Yoshizaki "Superconducting and magnetic properties of . . ." *Physica C*152 May 1988 pp. 408–412.
Lundy "Magnetic Properties of a chemically synthesized . . ." Symposium: Progest in High Temp. Super v. 17 Oct. 11–13, 1988 pp. 263–268.
Tan "TEM Study of superconducting (Pb, Bi)$_2$(Sr, Ca)$_3$Cu$_2$O$_8$" *Materials Sci. Forum*, v. 34–36 Aug. 1988 pp. 351–354.
Liu "A new high-Tc superconducting Thallium-lead-. . ." *Physica C* vol. 156(5) 1988 pp. 791–794 (Abstract).
Subramanian "Bulk Superconductivity up to 122k in the . . ." *Science* vol. 242 (4876) 1988 pp. 249–252 (Abstract).
Ganguli "Thallium lead calcium strontium cuprate . . ." *Physica C* vol. 156(5) 1988 pp. 788–790 (Abstract).
Weast + Artle *CRC Handbook of Chem + Physics* 63rd Ed. CRC Press Inc: 1982–1983 p. F–179.
Mizuno "Superconductivity of Bi$_2$Sr$_2$Ca$_2$Cu$_3$Pb$_x$O$_y$ (x=0.2, 0.4, 0.6)" *Jp. Jnl. of Appl. Physics* vol. 27 No. 7 pp. L1225–L1227 Jul. 1988.
Takano "High-Tc Phase Promoted and Stabilized in the Bi, Pb-Sr-Ca-Cu-O . . ." *Jp. Jnl. of Applied Phys.* vol. 27 No. 6 Jun. 1988 pp. L1041–L1043.
Yamada "Pb Introduction to the High-Tc Superconductor Bi-Sr-Ca-Cu-O" *Jap. Jnl. of Appld. Phys.* vol. 27 No. 6 Jun. 1988 pp. L996–L998.
Tamegai "Characterization of a Non-Superconducting Cuprate, Bi$_2$Sr$_2$YCu$_2$O$_{8.5}$" *Jap. Jnl. of Appld. Physics* vol. 27, No. 6 Jun. 1988 pp. L1074–L1076.
Fukushima "Electrical and Magnetic Properties in Bi$_2$Sr$_2$Ca$_{1-x}$Y$_x$Cu$_2$O$_{8+s}$," *Jap. Jnl. of Appld. Phys.* vol. 27 No. 8 Aug. 1988 pp. L1432–L1434.
*Physical Review Letters*, vol. 58(9), 2 Mar. 1987, "Superconductivity at 93 K in a New Mixed-Phase Y-Ba-Cu-O Compound System at Ambient Pressure" by M. K. Wu et al, pp. 908–910.

(List continued on next page.)

Primary Examiner—Paul Lieberman
Assistant Examiner—M. Kopec
Attorney, Agent, or Firm—Eugen E. Pacher

[57] ABSTRACT

A new class of high temperature superconductive oxides is disclosed. An exemplary member of the class has nominal composition Pb$_2$Sr$_2$Y$_{0.5}$Ca$_{0.5}$Cu$_3$O$_8$ and has a transition temperature $T_c$ (onset) of about 79K.

8 Claims, 5 Drawing Sheets

OTHER PUBLICATIONS

*Nature*, vol. 332, "Superconductivity in the Rare-Earth-Free Tl-Ba-Cu-O System Above Liquid-Nitrogen Temperature" by Z. Z. Sheng et al, pp. 55-58, 3 Mar. 1988.

*Science*, vol. 239, 26 Feb. 1988, "A New High-Temperature Superconductor: $Bi_2Sr_{3-x}Ca_xCu_2O_{8+y}$" by M. A. Subramanian et al pp. 1015-1017.

*Physical Review B*, vol. 37(7), 1 Mar. 1988, "Superconductivity above 20 K in the Ba-K-Bi-O System" by L. F. Mattheiss et al pp. 3745-3746.

*Journal of Applied Physics*, 49(1), Jan. 1978, "Picosecond Pulses on Superconducting Striplines" by R. L. Kautz, pp. 308-314.

*Solid State Communications*, vol. 17 (1975) "High-Temperature Superconductivity in the $BaPb_{1-x}Bi_xO_3$ System" by A. W. Sleight et al, pp. 27-28.

*Zeitschr. f. Physik B-Condensed Matter*, vol. 64 (1986) "Possible High $T_c$ Superconductivity in the Ba-La-Cu-O System" by J. G. Bednorz et al, pp. 189-193.

*Physical Review Letters*, vol. 58(9) 2 Mar. 1987, "High-Pressure Study of the New Y-Ba-Cu-O Superconducting Compound System" by P. H. Hor et al, pp. 911-912.

OXIDE SUPERCONDUCTORS, AND DEVICES AND SYSTEMS COMPRISING SUCH A SUPERCONDUCTOR

This application is a continuation of application Ser. No. 262,549, filed on Oct. 25, 1988, now abandoned.

FIELD OF THE INVENTION

This invention pertains to oxide superconductors, and to apparatus and systems comprising such superconductors.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., Nb$_3$Ge, probably the material with the highest transition temperature $T_c$ known prior to 1986).

In about 1975 superconductivity was discovered in a member of a new class of materials, namely metal oxides. See, for instance, A. W. Sleight et al, *Solid State Communications*, Vol. 17, page 27 (1975), and U.S. Pat. No. 3,932,315. The bismuth lead oxides of the paper and the '315 patent have crystal structures that are closely related to the well-known perovskite structure (having an ABO$_3$ structure, in which A and B designate appropriate metal elements, with the so-called A-site being crystallographically inequivalent to the B-site) with mixed B-site occupancy.

In 1986, J. G. Bednorz and K. A. Müller, *Zeitschr. f. Physik B-Condensed Matter*, Vol. 64, 189, reported the discovery of superconductivity in lanthanum barium copper oxide. This report stimulated worldwide research activity which very quickly resulted in further significant progress.

The progress has resulted, inter alia, to date in the discovery that compositions in the Y-Ba-Cu-O system can have $T_c$ above 77K, the boiling temperature of liquid N$_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ of about 90K. The research also resulted in the discovery of superconductivity in the Tl-Ba-Ca-Cu-O system (see, for instance, Z. Z. Sherig et al, *Nature* Vol. 332, pp. 55–58 (1988)).

A new class of copper-based oxide superconductors (Bi-Sr-Ca-Cu oxide) was recently discovered almost simultaneously in Japan and the USA, by groups lead by H. Maeda and C. W. Chu, respectively. See also, M. A. Subramaniam et al, *Science*, Vol. 239, pp. 1015–1017, Feb. 26, 1988, and U.S. patent application Ser. No. 155,330. The oxide has a transition temperature of about 80K, with a phase that has a substantially higher transition temperature frequently being present in samples of the material.

Recently a new class of (copper-free) bismuth-based oxide superconductors was discovered (see, for instance, U.S. patent application Ser. No. 185,750, filed Apr. 25, 1988 for D. W. Johnson et al, and Ser. No. 187,098, filed Apr. 28, 1988 for B. J. Batlogg et al, and also L. F. Mattheiss et al, *Physical Review B*, Vol. 37(7), pp. 3745–3746 (1988)). The members of the class have a perovskitelike crystal structure, with all substituents occupying A-sites. An exemplary member of the class has nominal composition Ba$_{0.6}$K$_{0.4}$BiO$_{3-\delta}$.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be perhaps the most advantageous cryogenic refrigerant, and attainment of superconductivity at liquid nitrogen temperature was a long-sought goal which until very recently appeared almost unreachable.

Although this goal has now been attained, there still exists scientific as well as technological interest in the discovery of novel superconductive oxides. Such compounds would, of course, be of immense help in the elucidation of the mechanism responsible for the high transition temperatures observed in some of the oxide superconductors. Furthermore, among such novel compounds may be some that have a relatively high transition temperature and show improvement in one or more properties relative to currently known high $T_c$ materials. For instance, many of the currently known high $T_c$ superconductors have in bulk form relatively low current carrying capacity, especially in the presence of a magnetic field. These materials also tend to be brittle and at least some compounds (e.g., the well-known "1-2-3" compound YBa$_2$Cu$_3$O$_7$) are relatively unstable in the presence of water vapor, CO, etc. Consequently, an intense effort has been underway worldwide to discover new superconductive oxides. This application discloses a new class of such oxides.

For a general overview of some potential applications of superconductors see, for instance, B. B. Schwartz and S. Foner, editors, *Superconductor Applications: SQUIDs and Machines*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets, for e.g., fusion generators, MHD generators, particle accelerators, levitated vehicles, magnetic separation, and energy storage, as well as junction devices and detectors. It is expected that many of the above and other applications of superconductivity would materially benefit if oxidic superconductive material could be used instead of the previously considered or used superconductors, and the newly discovered class of superconductors could contain materials that can advantageously be used in one or more of the above applications or, possibly, in a novel application not previously discussed.

THE INVENTION

In a broad aspect the invention is based on the discovery of a new class of superconducting oxides that typically have a transition temperature ($T_c$) greater than about 30K. Members of this class have a structure that is related to the perovskite structure, with a unit cell whose $\underline{a}$ and $\underline{b}$ dimensions are equal or nearly equal (frequently differing by less than 1%) and typical of simple perovskites, or small distortions thereof. The c-dimension of the unit cell typically is much greater than the a or b dimension, exemplarily being about four times that of the simple perovskite. A prototypical compound has the nominal formula $Pb_2Sr_2YCu_3O_8$, is orthorhombic, with a, b, and c being about 5.40, 5.43 and 15.78 Å, respectively.

A typical member of the new class of superconducting oxides has an atomic arrangement that comprises a central (with respect to the c-axis) plane of Cu atoms sandwiched between two Pb and O-containing planes. The unit cell also comprises 2 Cu and O-containing planes disposed outwardly of the sandwiching Pb and O-containing planes, with "CuO$_5$ pyramids" pointing towards the sandwiching planes in the manner CuO$_5$-pyramids point toward the central Cu plane in the prior art oxide superconductor $YBa_2Cu_3O_7$. Other members of the class may have crystal structures that are simple modifications of this structure, as will become apparent.

Some superconductors according to the invention may be considered to be derivatives of the above referred to prototypical composition (which itself is not believed to be a high temperature superconductor), obtained by incorporation of appropriate substituents. More generally, inventive superconductors have nominal composition $(X_2A_2Cu')B_{n-1}Cu_nO_{4+2n+\delta}$. In this expression the portion within the parenthesis represents the metal atoms of the central copper plane and of the two sandwiching planes. X is Pb, or Pb partially (typically less than 50%) substituted by chemically similar ions such as Bi or Tl. A represents ions that are in 9-coordination with oxygen, exemplarily Sr, Ba, Sr plus Ba, Sr plus Ca, Sr plus La, or Ba plus La, the amount of La chosen such that appropriate charge balance results (the appropriate amount of La typically will depend on n). Ca' is copper, Ag, or a mixture thereof, or Cu partially (typically less than 50%) substituted by Hg.

The non-O remainder of the above nominal formula represents the atomic planes disposed outwardly of the sandwiching planes. B represents ions that are in 8-coordination with oxygen, exemplarily one or more rare earths (atomic number 57–71, possibly excluding Ce), or one or more rare earths plus Ca and/or Sr, with the amount of Ca and/or Sr chosen such that appropriate charge balance results.

By "appropriate charge balance" we mean herein that the composition is chosen such that the Cu ions of the outwardly disposed planes have a formal valence in the approximate range 2–2.5. Divergences from the nominal formula amounts of A, Cu', B and Cu typically are at most about 10 atomic percent. It will be appreciated that some of the $4+2n+\delta$ oxygens are associated with the central and sandwiching planes, and some with the remainder of the structure. The number of outwardly disposed atomic planes of the structure determines n, with $\underline{n}$ commonly being 2. However, we currently believe that $\underline{n}$ can also be 1, with n=3 being also possible, and $\underline{n}$ being an integer greater than 3 not being excluded. In compounds according to the invention $0<\delta<2$, with $\delta$ typically being zero or small, exemplarily less than 1 or 0.25. As can be readily seen, the above referred to prototypical compound $(Pb_2Sr_2YCu_3O_8)$ corresponds to the n=2 case, with $\delta=0$.

By "ions that are in 8-coordination with oxygen" we mean metal ions which are surrounded in the inventive materials by 8 oxygen nearest neighbors, with the oxygens arranged in the form of a square prism. This group includes, in addition to the listed exemplary A-ions, ions whose diameter is within about ± 10% of that of the range defined by the exemplary ions. By "ions that are in 9-coordination with oxygen" we mean metal ions which, in the inventive materials, are surrounded by 9 oxygens that are arranged in the form of a singly capped square anti-prism. This group includes, in addition to the listed exemplary B-ions, ions whose diameter is within about ±10% of that of the range defined by the exemplary ions.

Figure 1:
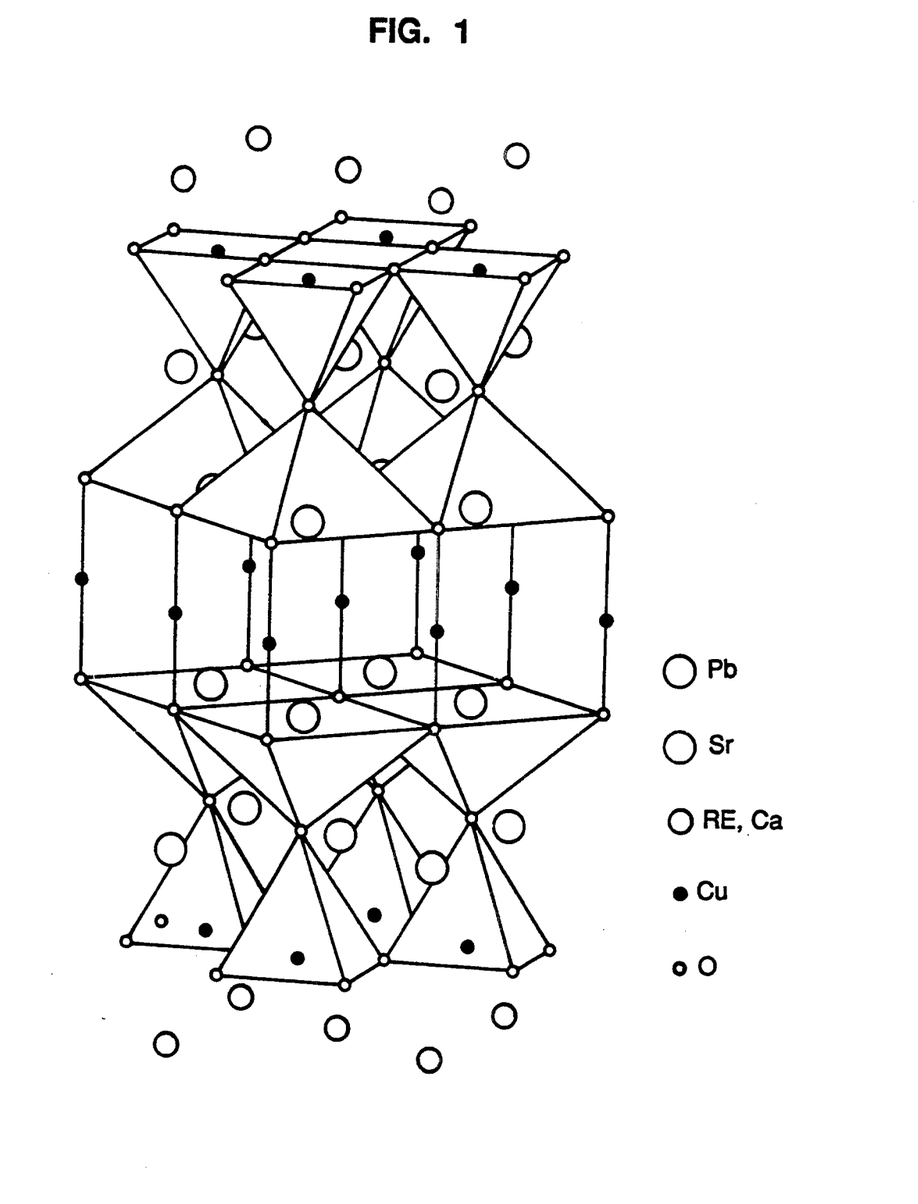

FIG. 1 is a schematic representation of the crystal structure of an exemplary member of the inventive class of oxide superconductors, namely, $Pb_2Sr_2RECu_3O_{8+\delta}$, where RE is a rare earth, or a rare earth and Ca. The depicted structure has orthorhombic symmetry, but at least some of the inventive compositions may have a higher symmetry tetragonal or lower symmetry monoclinic structure. These small differences are not expected to affect the basic structural arrangement. The figurer shows the PbO-Cu'O$_\delta$-PbO planes that are believed to be a distinguishing feature of the inventive compounds. The PbO$_5$ pyramids are shown to be separated by a single copper layer which, for $\delta=0$, has no oxygen in it. During an appropriate oxidation process, oxygen is apparently accommodated in this layer, typically resulting in an expansion of the c-axis. The Sr atoms are coordinated to nine oxygens, and the RE site is eight coordinate. In another exemplary compound according to the invention, Ca is partially substituted for the RE atom in the eight coordinate site.

Surprisingly, we have found that at least some of the inventive superconductors require a heat treatment that comprises heating in a relatively oxygen-poor atmosphere, e.g., in 99% $N_2$+1% $O_2$, typically containing less than about 8% of $O_2$. Some members of the novel class may be producible even in an oxygen free atmosphere. However, we believe that it is possible to produce some of the inventive superconductors by a process that comprises heat treatment in air, followed by a rapid quench, typically to room temperature. Minor experimentation may be necessary to determine optimal treatment conditions for any given member of the class.

We currently believe that compounds according to the invention typically require synthesis under mildly reducing conditions, chosen such as to maintain Pb in a 2+ oxidation state. Oxidation of $\delta=0$ compounds is possible but typically only at a relatively low temperature, chosen such that decomposition to a $Pb^{4+}$-containing perovskite is relatively slow.

Exemplarily, compounds according to the invention are synthesized by reaction of PbO with pre-reacted oxide precursors (e.g., Sr, Ca, rare earth, Cu oxides). The precursors can be prepared from oxides and carbonates in the appropriate metal ratios, calcined for, e.g., 16 hours (e.g., in dense $Al_2O_3$ crucibles) at 920–980° C. in air, with intermediate grinding. The thus prepared precursor is then mixed with PbO (the mixed powder is optionally pressed into a desired shape) and fired in a mildly reducing atmosphere (e.g., flowing 1% $O_2$ in $N_2$) at an appropriate reaction temperature (e.g., 840°–925° C.). Firing times typically are between 1 and about 5 hours. For instance, essentially single phase (as determined by a standard X-ray method) superconducting $Pb_2Sr_2Y_{1-x}Ca_xCu_3O_{8+\delta}(0<X\leq0.5)$ pellets were obtained by a process that comprised heating the pressed pellets in flowing 1% $O_2$ for 1 hour at 865° C., followed by 3 hours at 900° C., with cooling in the gas stream to room temperature in 15–30 minutes. Alternately, heating in the same atmosphere at 865° C. for a few hours has also resulted in essentially single phase material. Similar procedures are successful for other Sr-RE-Ca combinations.

At least some inventive compositions (e.g., $Pb_2Sr_2YCu_3O_{8+\delta}$) can be prepared by a procedure that comprises heating the PbO+ precursor mixture for a relatively short time (e.g., 1 hour) in air at a relatively high temperature (e.g., 920° C.), followed by quenching. It is to be noted that slow cooling results in partial decomposition of the compound due to oxidation. Relatively short reaction times typically are sufficient to result in single phase product and are preferable due to the relative volatility of PbO. It is also to be noted that the above described air-heating/quenching approach does not appear to work for some inventive compounds, e.g., $Pb_2Sr_2LaCu_3O_{8+\delta}$ and $Pb_2Sr_2LuCu_3O_{8+\delta}$.

Inventive compounds have also been prepared in single crystal form. Exemplarily, the compounds were grown from PbO and CuO-rich melts using the precursor technique, the melts cooled at 2° C./minute, after a 30 minute soak at 1025° C., to a temperature in the range 400°–800° C., followed by rapid cooling to room temperature. The procedure was carried out in flowing 1% $O_2+N_2$. The thus produced crystals generally were plate-like in habit.

The novel compounds can typically have a relatively wide range of oxygen content while still retaining the same basic crystal structure. For instance, in $Pb_2Sr_2Y_{0.75}Ca_{.25}Cu_3O_{8+\delta}$ values of $\delta$ as large as 1.8 have already been observed, and we believe that $\delta$ can be up to about 2. However, we believe that good superconductive properties generally will be associated with $\delta \leq 1$ or even $\leq 0.5$.

Single crystal and powder X-ray diffraction as well as electron microscopy indicate a basically orthorhombic crystal structure, but there are also indications that, at least for some of the inventive compounds, the structure may be weakly monoclinic. Both of these possibilities are intended to be included in the term "perovskite-like" or analogous terms. Diffraction studies have also revealed the presence of a variety of long period long range ordered superlattices (typically in the ab plane).

Figure 2:
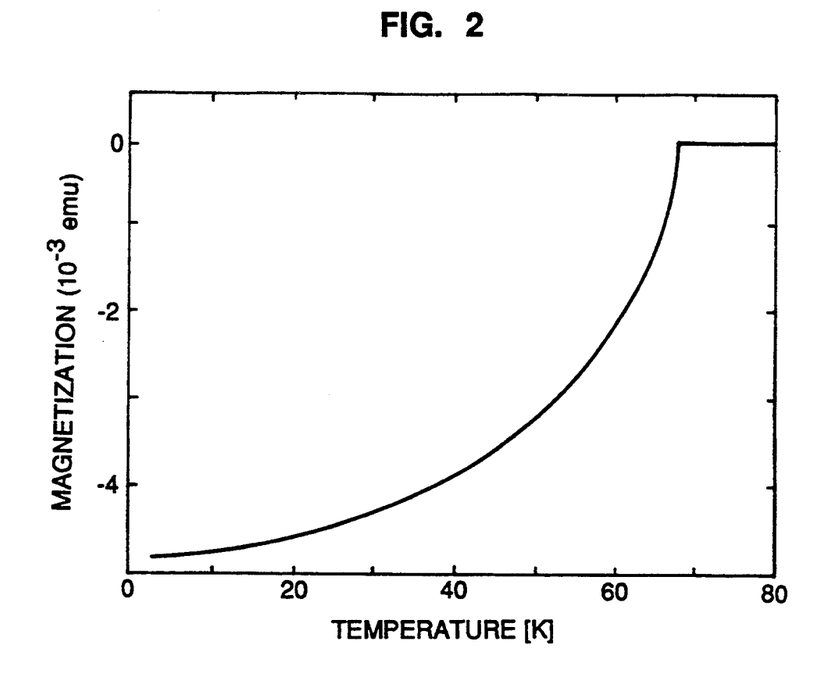
Figure 3:
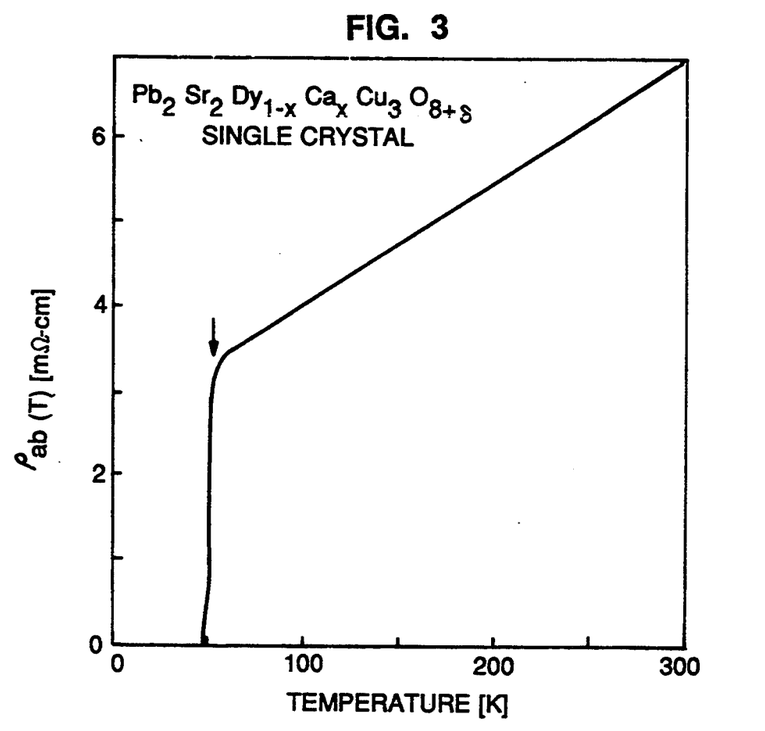
Figure 4:
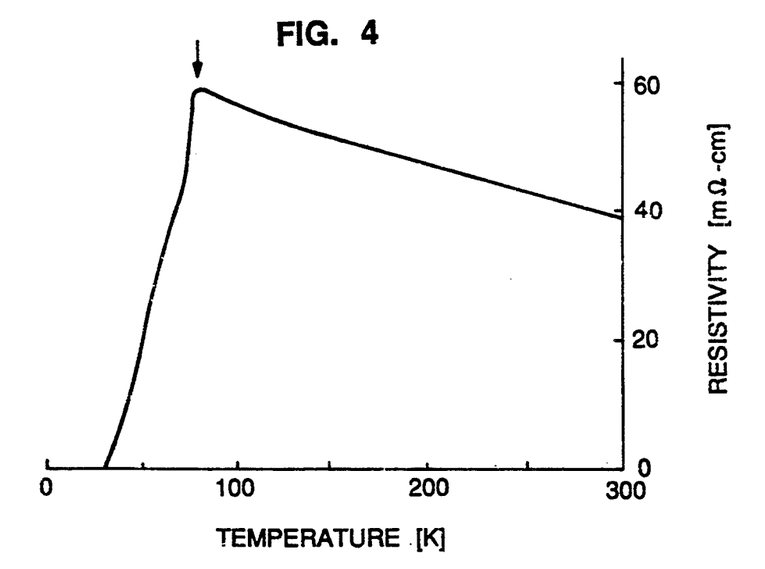

FIG. 2 shows the field (225 Oe)-cooled magnetization data for an exemplary inventive compound, namely, $Pb_2Sr_2Y_{0.5}Cu_3O_{8+\delta}(\delta \sim 0)$, showing a transition temperature $T_c$ of about 68K. FIG. 3 shows data on the temperature dependence of the resistivity of a single crystal of nominal composition $Pb_2Sr_2Dy_{1-x}Ca_x\text{-}Cu_3O_{8+\delta}$ in the ab plane, indicating $T_c(R=0)$ of about 46K. FIG. 4 shows similar data for polycrystalline $Pb_2Sr_2Y_{.5}Ca_{.5}Cu_3O_8$, showing onset of superconductivity at 79K.

The above described techniques were used to produce essentially single phase materials (within the limits of standard X-ray techniques). However, for at least some applications single phase material may not be required, and we contemplate inventive superconductive bodies comprising two or more oxides, provided at least one of the oxides is a member of the inventive class, and the member is present in an operative amount, i.e., in such an amount that it imparts superconductive properties to the body.

The inventive materials can be processed in substantially the same way as prior art oxide superconductors, e.g., pressed into bulk bodies, or incorporated into a slurry and formed into bodies such as tape by standard ceramic techniques. They can also be incorporated into a paste, and a patterned superconductor formed on a substrate by silk screening and firing. A slurry can also be used to coat an appropriately inert wire (e.g., Ag wire) to produce a superconductive wire. Furthermore, it is expected that the inventive materials can be deposited in thin film form, e.g., by sputtering or evaporation of the metal constituents and oxidation of the deposit.

Superconductors according to the invention potentially are useful in many of the applications for which prior art superconductors were proposed or are used. FIGS. 5–8 illustrate exemplary potential applications.

Figure 5:
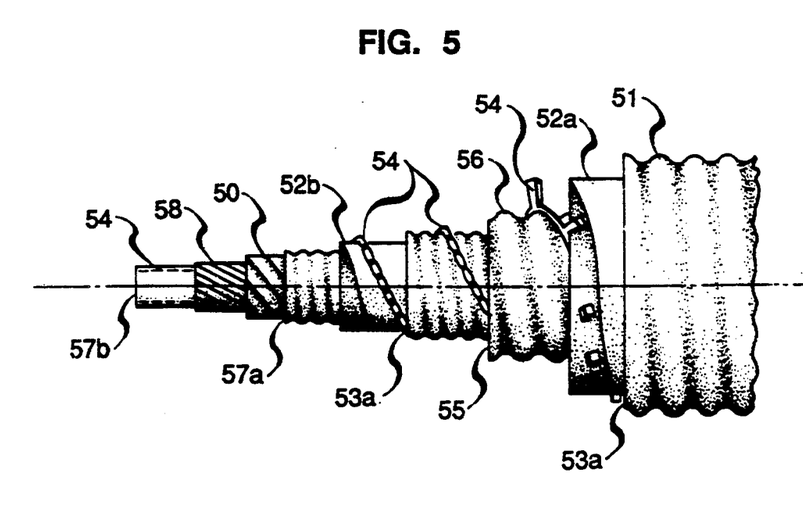
Figure 6:
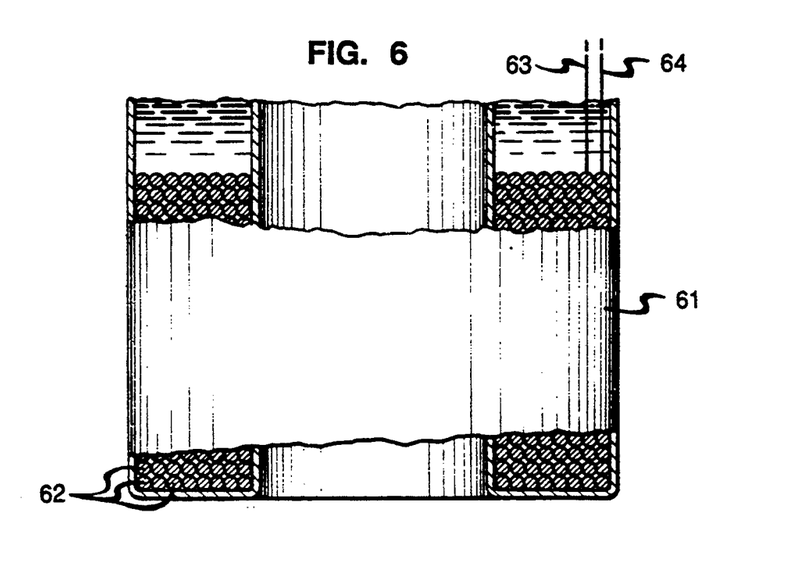
Figure 7:
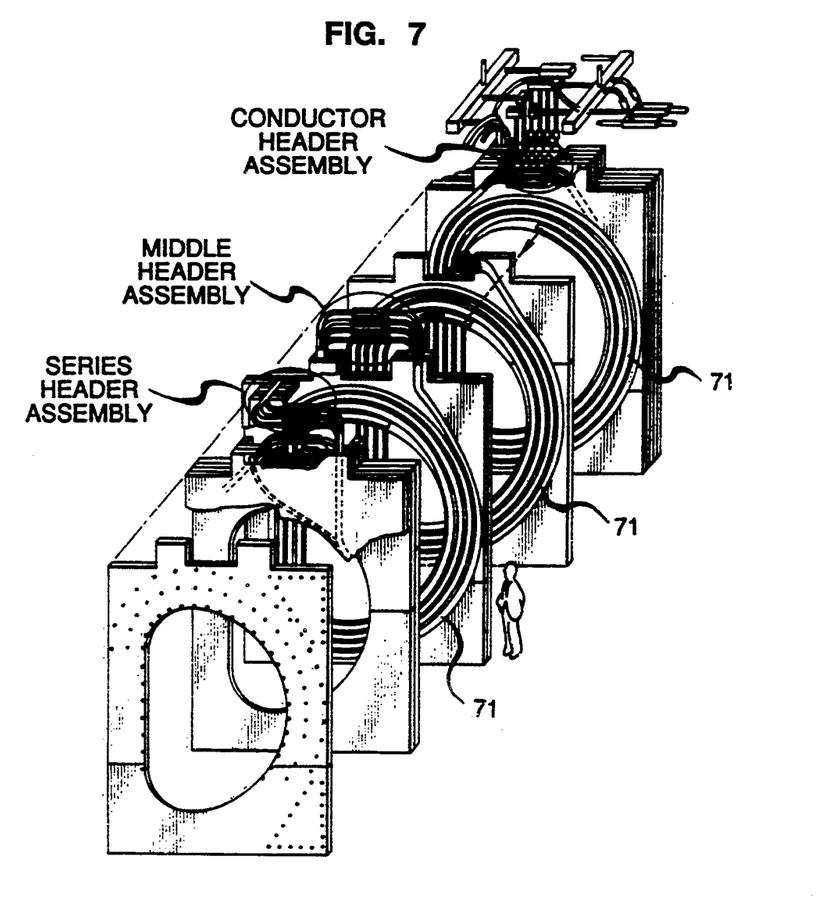

The structure shown in FIG. 5 is described in detail in G. Bonder, "Large Scale Applications of Superconductivity", in *Superconductor Applications: SQUIDs and Machines*, B. B. Schwartz, and S. Foner, editors, (Plenum Press, New York, 1977). Briefly, the structure depicted consists of an outer sheathing 51, thermal insulation layers 52a and 52b, evacuated annular regions 53a and 53b, spacers 54, nitrogen-filled annular region 55, heat shield 56, and coolant regions 57a and 57b. Element 58 is a superconductor material in accordance with the invention. FIG. 6 shows a superconducting magnet comprising an annular cryostat 61 filled with an appropriate cryogenic liquid and containing turns 62 of a superconductive material according to the invention. Terminal leads 63 and 64 are shown emerging from the coil. The structure of FIG. 6 is described in R. A. Hein and D. U. Gubser, "Applications in the United States", in *Superconductor Materials Science: Metallurgy, Fabrication, and Applications*, S. Foner and B. B. Schwartz, editors, (Plenum Press, New York, 1981). The superconducting elements shown in FIG. 7 as windings 71 are made of a material herein. The structure of FIG. 7 is considered exemplary of those expected to find broad-scale use for containment of fusion reactions.

Figure 8:
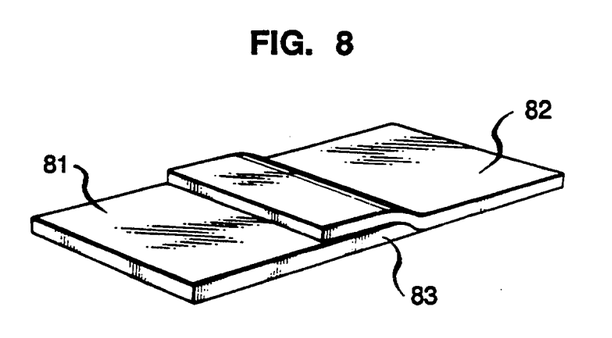

FIG. 8 schematically shows a superconductive thin film device, a Josephson junction. The structure consists of two superconducting layers 81 and 82 separated by a tunneling barrier 83. Josephson junction devices are described in M. R. Beasley and C. J. Kircher "Josephson Junction Electronics: Materials Issues and Fabrication Techniques", ibid.

Figure 9:
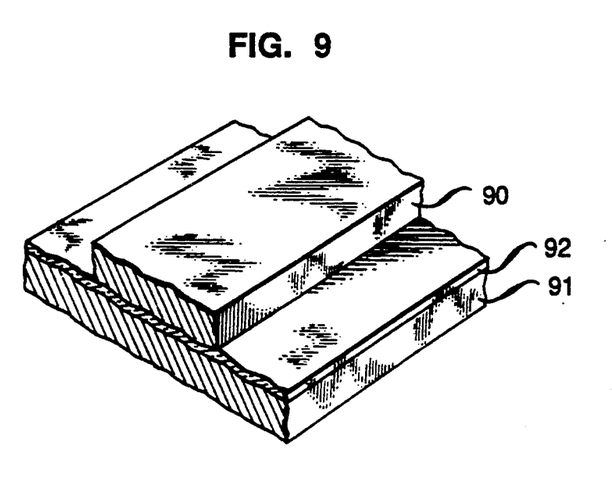

FIG. 9 is a perspective view of a section of superconducting stripline. Structures of the type depicted may usefully serve as interconnections (rather than many-kilometer long distance transmission). It is structures of this type that are expected to permit operation at significantly increased speed of present commercial apparatus. The structure (which is depicted in *Journal of Applied Physics*, Vol. 49, No. 1, page 308, January 1978) consists of a superconducting strip 90 insulated from superconducting groundplane 91 by dielectric layer 92. Considerations entailed in dimensioning the structure depend upon intended use and are generally described in the above reference.

Example 1: $SrCO_3$, $Y_2O_3$, $CaCO_3$ and CuO were mixed in molar ratio 4:1:1:6, the mixture was fired in air at 920° C. for 16 hours, with one intermediate grinding. The resulting material of composition $Sr_2Y_{.5}Ca_{.5}Cu_3O_x$ was ground and mixed with PbO in molar ratio 1:2. The powder mixture was pressed into a pellet. The pellet was heated to 865° C., fired at that temperature for 16 hours, and cooled to room temperature in about 15 minutes, all in flowing 1% $O_2+99\%$ $N_2$. The resulting ceramic pellet of composition $Pb_2Sr_2Y_{0.5}Ca_{0.5}Cu_3O_8$ had $T_c$ (onset) of about 79K.

Examples 2–15: Ceramic pellets are prepared substantially as described in Example 1, except that $Y_2O_3$ is replaced by a rare earth oxide (other than Ce oxide). The resulting materials have superconductive transition temperatures above 30K. Exemplary of the resulting compositions is $Pb_2Sr_2Dy_{0.5}Ca_{0.5}Cu_3O_8$.

Examples 16 and 17: Materials of composition $Pb_2Sr_{2-x}Ca_xY_{0.5}Ca_{0.5}Cu_3O_8 (x=0.25, 0.5)$ were synthesized substantially as described in Example 1. The resulting mixed oxide ceramic pellets had a superconductive transition temperature above 30K. The $x=0.25$ material was essentially single phase.

Example 18: Material of composition $Pb_2Sr_2Y_{0.5}Ca_{0.5}Cu_{3-x}Ag_xO_8$ ($x \sim 1$) is synthesized substantially as described in Example 1, except that the precursor does not contain any silver oxide. Appropriate amounts of PbO and $Ag_2O$ are mixed with the precursor, a pellet is formed and fired for 16 hours at 840° C. The resulting material is superconducting, with a transition temperature above about 30K.

We claim:

1. An article comprising a superconductive element comprising at least one superconductive material having a perovskite-like crystal structure and nominal formula $(Pb_2A_2 Cu')BCu_2O_{8+\delta}$ with (A selected from the group consisting of Sr, Ba, Sr and Ba, Sr and Ca, and Sr, Ba and Ca; Cu' is selected from the group consisting of Cu, Ag, and Cu and Ag;) (B is selected from the group consisting of one or more RE and Ca, one or more RE and Sr, and one or more RE and Ca and Sr; where RE is Y and the elements of atomic number 57–71); wherein $0 \leq \delta \leq 1$; wherein divergence of the composition of the superconductive material from the nominal formula amounts of Pb, A, Cu', B, and/or Cu is at most about 10 atomic %; wherein associated with the crystal structure is an ab-plane, the crystal structure comprising a central crystal plane that comprises Cu', and further comprising two Pb- and oxygen-containing crystal planes sandwiching the central plane, with all three said planes being parallel to the ab- plane; and wherein the composition is selected such that the superconductive material has a transition temperature of at least about 30K.

2. An article comprising a superconductive element comprising at least one superconductive material having a perovskite-like crystal structure and nominal formula $(X_2A_2Cu') BCu_2O_{8+\delta}$, where X is selected from the group consisting of Pb, Pb and Bi, Pb and Tl, and Pb, Bi and Tl, with X being at least 50 atomic % of Pb; A is selected from the group consisting of Sr, Ba, Sr and Ba, Sr and Ca, and Sr, Ba and Ca; Cu' is selected from the group consisting of Cu, Ag, and Cu and Ag; B is selected from the group consisting of one or more RE and Ca, one or more RE and St, and one or more RE and Ca and Sr; where RE is Y and the elements of atomic number 57–71; wherein $0 \leq \delta \leq 1$; wherein divergence of the composition of the superconductive material from the nominal formula amounts of X, A, Cu', B, and/or Cu is at most about 10 atomic %; wherein associated with the crystal structure is an ab-plane, the crystal structure comprising a central crystal plane that comprises Cu', and further comprising two X- and oxygen-containing crystal planes sandwiching the central platte, with all three said planes being parallel to the ab-plane; and wherein the composition is selected such that the superconductive material has a transition temperature of at least about 30K.

3. Apparatus of claim 2, wherein the apparatus depends for its operation upon current through the superconductive element.

4. Apparatus of claim 3, wherein the apparatus in operation produces a magnetic field by virtue of current through the element.

5. Apparatus of claim 3, wherein the apparatus is a transmission line for carrying electrical power.

6. Apparatus of claim 3, wherein the apparatus comprises a substrate, the element comprising a thin superconductive layer disposed on the substrate.

7. A method of producing a superconductive element as described in claim 2, the method comprising heat treating the superconductive material in a slightly reducing atmosphere.

8. A method of producing a superconductive element as described in claim 2, the method comprising heating the superconductive material to a temperature above about 800° C. in an oxidizing atmosphere and cooling the material from that temperature such that substantial further oxidation does not occur.

* * * * *